United States Patent
Cui

(10) Patent No.: US 12,279,501 B2
(45) Date of Patent: Apr. 15, 2025

(54) ARRAY SUBSTRATE AND DISPLAY PANEL

(71) Applicant: BOE TECHNOLOGY GROUP CO., LTD., Beijing (CN)

(72) Inventor: Ying Cui, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 633 days.

(21) Appl. No.: 17/556,267

(22) Filed: Dec. 20, 2021

(65) Prior Publication Data

US 2022/0310703 A1    Sep. 29, 2022

(30) Foreign Application Priority Data

Mar. 26, 2021  (CN) .......................... 202110325951.6

(51) Int. Cl.
*H01L 27/32*     (2006.01)
*H01L 51/56*     (2006.01)
(Continued)

(52) U.S. Cl.
CPC ......... *H10K 59/352* (2023.02); *H10K 59/122* (2023.02); *H10K 71/00* (2023.02); *H10K 59/1201* (2023.02); *H10K 59/353* (2023.02)

(58) Field of Classification Search
CPC ............................................ H10K 59/35–353
See application file for complete search history.

(56) References Cited

U.S. PATENT DOCUMENTS

2019/0064980 A1*   2/2019  Oh ........................ G06F 3/0445
2019/0179445 A1*   6/2019  Moon ................... G09G 3/2003
(Continued)

FOREIGN PATENT DOCUMENTS

CN          104681594 A      6/2015
CN          105336881 A      2/2016
(Continued)

OTHER PUBLICATIONS

Machine translation, Cui, Chinese Pat. Pub. No. CN-111599942-A, translation date: Jul. 17, 2024, Clarivate Analytics, all pages ( Year: 2024).*

(Continued)

*Primary Examiner* — Victoria K. Hall
(74) *Attorney, Agent, or Firm* — HOUTTEMAN LAW LLC

(57) ABSTRACT

An array substrate is provided, including: multiple columns of pixel units on a substrate, including multiple first and second pixel unit columns alternately in a row direction; each first/second pixel unit column includes multiple first/second pixel units in a column direction; first and second pixel units adjacent to each other are staggered in the row direction in adjacent first and second pixel unit columns. Each first/second pixel unit includes at least two sub-pixels of different colors in multiple columns, and each column of sub-pixels have a same color; each first/second pixel unit includes one rectangular sub-pixel and at least one non-rectangular sub-pixel on opposite first and/or second sides of the rectangular sub-pixel and having a first side opposite to a long side and/or a width of the rectangular sub-pixel, and an orthographic projection of the non-rectangular sub-pixel on the first side is within the first side.

20 Claims, 7 Drawing Sheets

(51) Int. Cl.
  *H10K 59/122* (2023.01)
  *H10K 59/35* (2023.01)
  *H10K 71/00* (2023.01)
  H10K 59/12 (2023.01)

(56) References Cited

U.S. PATENT DOCUMENTS

2023/0098247 A1* 3/2023 Cui ................. H10K 59/353
                                                            257/40
2024/0224685 A1* 7/2024 Mei .................... C23C 14/24

FOREIGN PATENT DOCUMENTS

| CN | 105976757 | A |   | 9/2016  |                |
|----|-----------|---|---|---------|----------------|
| CN | 109308860 | A |   | 2/2019  |                |
| CN | 109449314 | A |   | 3/2019  |                |
| CN | 208570613 | U |   | 3/2019  |                |
| CN | 110491927 | A |   | 11/2019 |                |
| CN | 111599942 | A | * | 8/2020  | ....... H01L 27/3218 |

OTHER PUBLICATIONS

China Patent Office, CN202110325951.6 First Office Action issued on Apr. 7, 2022.

* cited by examiner

ARRAY SUBSTRATE AND DISPLAY PANEL

CROSS REFERENCE TO RELATED APPLICATIONS

The present application claims the priority of the Chinese Patent Application No. 202110325951.6 filed on Mar. 26, 2021, the content of which is incorporated herein by reference in its entirety.

TECHNICAL FIELD

The present disclosure relates to the field of display technology, and in particular to an array substrate and a display panel.

BACKGROUND

Organic Light Emitting Diodes (OLEDs) are widely applied due to their self-luminescence, wide viewing angle, high contrast, low power consumption, and the like.

An organic light emitting diode display panel generally includes a plurality of pixel units, and each pixel unit includes three sub-pixels, i.e., a red sub-pixel, a blue sub-pixel, and a green sub-pixel. The efficiency and lifetime of the blue light emitting material of the blue sub-pixel are lower than those of the red light emitting material of the red sub-pixel and the green light emitting material of the green sub-pixel, so the blue sub-pixel generally needs to be designed relatively larger to compensate for the deficiency of the blue light emitting material.

SUMMARY

In a first aspect, the present disclosure provides an array substrate, including: a substrate; and a plurality of pixel units on the substrate and arranged in a plurality of columns, wherein the plurality of pixel units include a plurality of first pixel unit columns and a plurality of second pixel unit columns alternately arranged in a row direction; each of the plurality of first pixel unit columns includes a plurality of first pixel units sequentially arranged in a column direction; each of the plurality of second pixel unit columns includes a plurality of second pixel units sequentially arranged in the column direction; first pixel units and second pixel units adjacent to each other are staggered in the row direction in a first pixel unit column and a second pixel unit column adjacent to each other, wherein each of the first pixel unit and the second pixel unit includes at least two sub-pixels of different colors, the sub-pixels of different colors of the plurality of pixel units are arranged in a plurality of columns, and each column of the sub-pixels have a same color; each of the first pixel unit and the second pixel unit includes one rectangular sub-pixel and at least one non-rectangular sub-pixel on at least one of first and second sides of the rectangular sub-pixel opposite to each other in the row direction, and each of the at least one non-rectangular sub-pixel has a first side opposite to at least one of a long side or a width of the rectangular sub-pixel, and an orthographic projection of the at least one non-rectangular sub-pixel on the first side of the at least one non-rectangular sub-pixel is within the first side.

In some embodiments of the present disclosure, each of the first pixel unit and the second pixel unit includes a first sub-pixel, a second sub-pixel and a third sub-pixel; the second sub-pixel is the rectangular sub-pixel, the at least one non-rectangular sub-pixel includes two non-rectangular sub-pixels, and the first sub-pixel and the third sub-pixel are the non-rectangular sub-pixels; in the first pixel unit, the first and third sub-pixels are at first and second sides of the second sub-pixel, respectively; and in the second pixel unit, the third sub-pixel and the first sub-pixel are at first and second sides of the second sub-pixel, respectively.

In some embodiments of the present disclosure, a plurality of second sub-pixels in each of the plurality of first pixel unit columns are sequentially arranged along the column direction; a plurality of second sub-pixels in each of the plurality of second pixel unit columns are sequentially arranged along the column direction; in first and second pixel unit columns adjacent to each other arranged in the row direction, two third sub-pixels of any adjacent first and second pixel units have opposite sides, and a plurality of third sub-pixels of the plurality of first pixel units and a plurality of third sub-pixels of the plurality of second pixel units are alternately arranged in the column direction; and in second and first pixel unit columns adjacent to each other arranged in the row direction, two first sub-pixels of any adjacent second and first pixel units have opposite sides, and a plurality of first sub-pixels of the plurality of first pixel units and a plurality of first sub-pixels of the plurality of second pixel units are alternately arranged in the column direction.

In some embodiments of the present disclosure, the array substrate further includes: a plurality of first pixel defining layers, each of which is between any adjacent sub-pixels of the same color; and a plurality of second pixel defining layers, each of which is between any adjacent sub-pixels of different colors, wherein an angle between an extending direction of at least one of the plurality of first pixel defining layers and an extending direction of at least one of the plurality of second pixel defining layers is an acute angle.

In some embodiments of the present disclosure, the at least one non-rectangular sub-pixel each is a triangular or trapezoidal sub-pixel.

In some embodiments of the present disclosure, the at least one non-rectangular sub-pixel includes at least one isosceles triangular sub-pixel, and a length of a base of the isosceles triangular sub-pixel is equal to a length of the long side of the rectangular sub-pixel; and the base of the isosceles triangular sub-pixel is opposite to one long side of the rectangular sub-pixel.

In some embodiments of the present disclosure, the isosceles triangular sub-pixel has a height equal to the width of the rectangular sub-pixel.

In some embodiments of the present disclosure, each of the first pixel unit and the second pixel unit includes one first sub-pixel, one second sub-pixel, and one third sub-pixel, the at least one isosceles triangular sub-pixel includes the first sub-pixel and the third sub-pixel, the rectangular sub-pixel includes the second sub-pixel, in first and second pixel unit columns adjacent to each other, one leg of the first sub-pixel of each first pixel unit is opposite to a corresponding leg of the first sub-pixel of the second pixel unit adjacent to the first pixel unit, so that all the first sub-pixels in first and second pixel unit columns adjacent to each other are arranged in a column, and an orthographic projection of the first pixel defining layers between the first sub-pixels on the substrate has a zigzag shape; in first and second pixel unit columns adjacent to each other, one leg of the third sub-pixel of each first pixel unit is opposite to a corresponding leg of the third sub-pixel of the second pixel unit adjacent to the first pixel unit, so that all the third sub-pixels in first and second pixel unit columns adjacent to each other are arranged in a column, and an orthographic projection of the first pixel defining layers between the third sub-pixels on the substrate has a zigzag shape; and in first and second pixel unit columns adjacent to each other, the first and second pixel units adjacent to each other are spaced apart from each other in the column direction by a distance equal to half of a length of the long side of the rectangular second sub-pixel.

In some embodiments of the present disclosure, in each of the first pixel unit and the second pixel unit, the second sub-pixel is between a base of the first sub-pixel and a base of the third sub-pixel.

In some embodiments of the present disclosure, the first sub-pixel is a red sub-pixel, the second sub-pixel is a blue sub-pixel, and the third sub-pixel is a green sub-pixel.

In some embodiments of the present disclosure, the plurality of first pixel defining layers between any two adjacent first sub-pixels in each column of the first sub-pixels have a one-piece structure; the plurality of first pixel defining layers between any two adjacent third sub-pixels in each column of the third sub-pixels have a one-piece structure; the plurality of second pixel defining layers between each column of first sub-pixels and each column of second sub-pixels have a one-piece structure, such that an orthographic projection of the plurality of second pixel defining layers on the substrate is a straight line; the plurality of second pixel defining layers between each column of third sub-pixels and each column of second sub-pixels have a one-piece structure, such that an orthographic projection of the plurality of second pixel defining layers on the substrate is a straight line; the plurality of first pixel defining layers further include a first pixel defining layer between any two adjacent second sub-pixels of each column of second sub-pixels; the extending direction of each of the plurality of first pixel defining layers between any two adjacent first sub-pixels in each column of first sub-pixels is at an acute angle with the extending direction of each of the plurality of second pixel defining layers between each column of the first sub-pixels and each column of the second sub-pixels; and the extending direction of each of the plurality of first pixel defining layers between any two adjacent third sub-pixels in each column of third sub-pixels is at an acute angle with the extending direction of each of the plurality of second pixel defining layers between each column of the third sub-pixels and each column of the second sub-pixels.

In some embodiments of the present disclosure, a height of the isosceles triangular sub-pixel is in a range of 10 micrometers to 100 micrometers, and a length of the base of the isosceles triangular sub-pixel is in a range of 50 micrometers to 200 micrometers; and a length of the long side of the rectangular sub-pixel is in a range of 50 micrometers to 200 micrometers and a length of the width of the rectangular sub-pixel in a range of 10 micrometers to 100 micrometers.

In some embodiments of the present disclosure, the at least one non-rectangular sub-pixel includes at least one isosceles trapezoidal sub-pixel, and a length of a lower base of the isosceles trapezoidal sub-pixel is equal to a length of the long side of the rectangular sub-pixel, and the lower base of the isosceles trapezoidal sub-pixel is opposite to one long side of the rectangular sub-pixel.

In some embodiments of the present disclosure, each of the first pixel unit and the second pixel unit includes one first sub-pixel, one second sub-pixel and one third sub-pixel, the at least one non-rectangular sub-pixel includes at least one isosceles trapezoidal sub-pixel, which includes the first sub-pixel and the third sub-pixel, and the rectangular sub-pixel includes the second sub-pixel; and in each of the first pixel unit and the second pixel unit, the second sub-pixel is between a lower base of the first sub-pixel and a lower base of the third sub-pixel.

In some embodiments of the present disclosure, a distance of a top surface of the first pixel defining layer from the substrate is smaller than that of a top surface of the second pixel defining layer from the substrate; the top surface is a surface of a pixel defining layer away from the substrate.

In a second aspect, the present disclosure provides a display panel including the above array substrate.

In some embodiments of the present disclosure, each of the first pixel unit and the second pixel unit includes a first sub-pixel, a second sub-pixel and a third sub-pixel; the second sub-pixel is the rectangular sub-pixel, the at least one non-rectangular sub-pixel includes two non-rectangular sub-pixels, and the first sub-pixel and the third sub-pixel are the non-rectangular sub-pixels; in the first pixel unit, the first and third sub-pixels are at first and second sides of the second sub-pixel, respectively; in the second pixel unit, the third sub-pixel and the first sub-pixel are at first and second sides of the second sub-pixel, respectively; wherein a plurality of second sub-pixels in each of the plurality of first pixel unit columns are sequentially arranged along the column direction; a plurality of second sub-pixels in each of the plurality of second pixel unit columns are sequentially arranged along the column direction; in first and second pixel unit columns adjacent to each other arranged in the row direction, two third sub-pixels of any adjacent first and second pixel units have opposite sides, and a plurality of third sub-pixels of the plurality of first pixel units and a plurality of third sub-pixels of the plurality of second pixel units are alternately arranged in the column direction; and in second and first pixel unit columns adjacent to each other arranged in the row direction, two first sub-pixels of any adjacent second and first pixel units have opposite sides, and a plurality of first sub-pixels of the plurality of first pixel units and a plurality of first sub-pixels of the plurality of second pixel units are alternately arranged in the column direction.

In some embodiments of the present disclosure, the array substrate further includes: a plurality of first pixel defining layers, each of which is between any adjacent sub-pixels of the same color; and a plurality of second pixel defining layers, each of which is between any adjacent sub-pixels of different colors, wherein an angle between an extending direction of at least one of the plurality of first pixel defining layers and an extending direction of at least one of the plurality of second pixel defining layers is an acute angle.

In some embodiments of the present disclosure, each of the first pixel unit and the second pixel unit includes one first sub-pixel, one second sub-pixel, and one third sub-pixel, the at least one isosceles triangular sub-pixel includes the first sub-pixel and the third sub-pixel, the rectangular sub-pixel includes the second sub-pixel, in first and second pixel unit columns adjacent to each other, one leg of the first sub-pixel of each first pixel unit is opposite to a corresponding leg of the first sub-pixel of the second pixel unit adjacent to the first pixel unit, so that all the first sub-pixels in first and second pixel unit columns adjacent to each other are arranged in a column, and an orthographic projection of the first pixel defining layers between the first sub-pixels on the substrate has a zigzag shape; in first and second pixel unit columns adjacent to each other, one leg of the third sub-pixel of each first pixel unit is opposite to a corresponding leg of the third sub-pixel of the second pixel unit adjacent to the first pixel unit, so that all the third sub-pixels in first and second pixel unit columns adjacent to each other are arranged in a column, and an orthographic projection of the first pixel defining layers between the third sub-pixels on the substrate has a zigzag shape; in first and second pixel unit columns adjacent to each other, the first and second pixel units adjacent to each other are spaced apart from each other in the column direction by a distance equal to half of a length of the long side of the rectangular second sub-pixel; and wherein in each of the first pixel unit and the second pixel unit, the second sub-pixel is between a base of the first sub-pixel and a base of the third sub-pixel.

In some embodiments of the present disclosure, the plurality of first pixel defining layers between any two adjacent first sub-pixels in each column of the first sub-pixels have a one-piece structure; the plurality of first pixel defining layers between any two adjacent third sub-pixels in each column of the third sub-pixels have a one-piece structure; the plurality of second pixel defining layers between each column of first sub-pixels and each column of second sub-pixels have a one-piece structure, such that an orthographic projection of the plurality of second pixel defining layers on the substrate is a straight line; the plurality of second pixel defining layers between each column of third sub-pixels and each column of second sub-pixels have a one-piece structure, such that an orthographic projection of the plurality of second pixel defining layers on the substrate is a straight line; the plurality of first pixel defining layers further include a first pixel defining layer between any two adjacent second sub-pixels of each column of second sub-pixels; the extending direction of each of the plurality of first pixel defining layers between any two adjacent first sub-pixels in each column of first sub-pixels is at an acute angle with the extending direction of each of the plurality of second pixel defining layers between each column of the first sub-pixels and each column of the second sub-pixels; and the extending direction of each of the plurality of first pixel defining layers between any two adjacent third sub-pixels in each column of third sub-pixels is at an acute angle with the extending direction of each of the plurality of second pixel defining layers between each column of the third sub-pixels and each column of the second sub-pixels.

BRIEF DESCRIPTION OF DRAWINGS

The accompanying drawings, which are included to provide a further understanding of the present disclosure and constitute a part of this specification, illustrate the present disclosure together with the following exemplary embodiments, but are not intended to limit the present disclosure. In the drawings.

Figure 1:
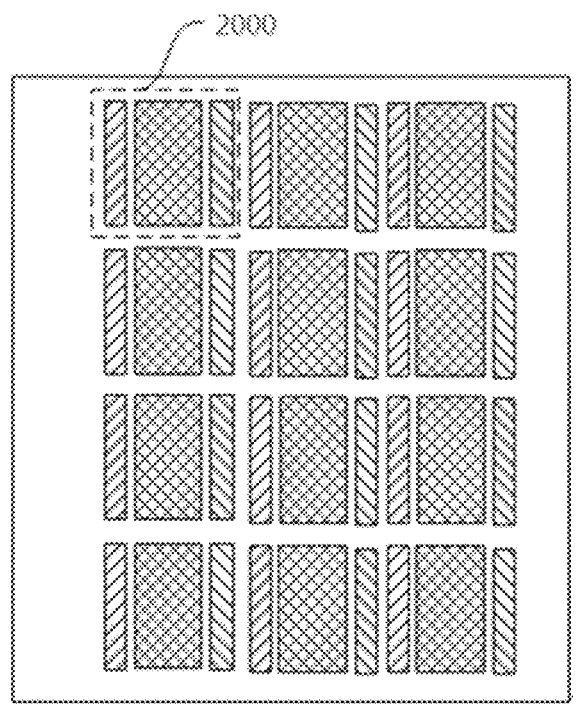
FIG. 1 is a schematic diagram of a structure of an array substrate in the related art.

The reference numbers are: 1. a substrate; 2. a pixel unit; 21. a first sub-pixel; 22. a second sub-pixel; 23. a third sub-pixel; 31. a first pixel defining layer; 32. a second pixel defining layer.

DETAIL DESCRIPTION OF EMBODIMENTS

To enable one of ordinary skill in the art to better understand technical solutions of the present disclosure, the present disclosure will be further described below with reference to the accompanying drawings and exemplary embodiments.

In the present disclosure, two structures being provided (or disposed or arranged) in a same layer means that the two structures are made of a same material layer and thus are in a same layer in a stacking relationship (i.e., a relationship between stacked layers), but does not mean that they are equidistant from a same substrate nor that other layers between one structure and the substrate are the same as those between the other structure and the substrate.

In the present disclosure, a "patterning process" refers to step(s) of forming a structure having a certain pattern, and may be a photolithography process including one or more steps of forming a material layer, coating a photoresist, exposing, developing, etching, stripping off the photoresist, and the like. Alternatively, the "patterning process" may be an imprinting process, an inkjet printing process, or another process.

The present disclosure will be described in more detail below with reference to the accompanying drawings. Like elements are denoted by like reference symbols throughout the various figures. For purposes of clarity, the various features in the drawings are not necessarily drawn to scale. Further, certain well-known elements may not be shown in the figures.

Numerous specific details of the present disclosure, such as structures, materials, dimensions, processing processes and techniques of the components, are set forth in the following description in order to provide a more thorough understanding of the present disclosure. However, as will be understood by one of ordinary skill in the art, the present disclosure may be practiced without these specific details.

Figure 2:
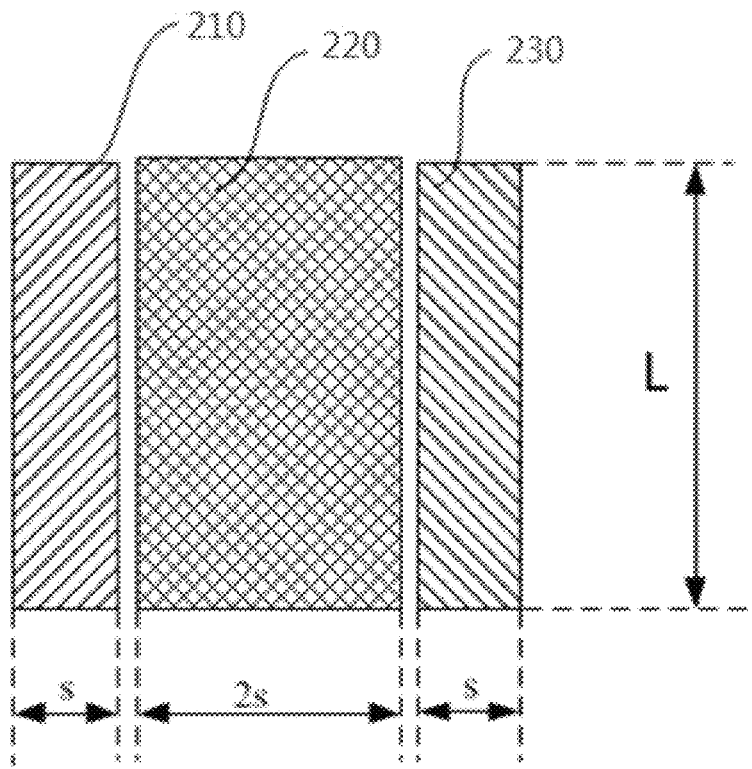
FIG. 2 is a schematic diagram of a structure of a pixel unit of an array substrate in the related art.

FIG. 1 is a schematic diagram of a structure of an array substrate in the related art; FIG. 2 is a schematic diagram of a structure of a pixel unit of an array substrate in the related art. An organic light emitting diode display panel in the related art generally includes a plurality of pixel units 2000, and each pixel unit 2000 includes three sub-pixels, i.e., a first sub-pixel 210, a second sub-pixel 220, and a third sub-pixel 230. As an example, the first sub-pixel 210 is a red sub-pixel, the second sub-pixel 220 is a blue sub-pixel, and the third sub-pixel 230 is a green sub-pixel. The efficiency and lifetime of the blue light emitting material of the blue sub-pixel are lower than those of the red light emitting material of the red sub-pixel and the green light emitting material of the green sub-pixel, so the blue sub-pixel generally needs to be designed relatively larger to compensate for the deficiency of the blue light emitting material.

Specifically, as shown in FIGS. 1 and 2, the red, green, and blue sub-pixels are each shaped as rectangles in shape; and the rectangles of the red, green, and blue sub-pixels have an equal long side (for example, as shown in FIGS. 1 and 2, the rectangles of the red, green, and blue sub-pixels have a long side L); and a width (wide side) of the blue sub-pixel is greater than that of each of the red and green sub-pixels (for example, as shown in FIGS. 1 and 2, the width of the blue sub-pixel is 2s, and the widths of the red and green sub-pixels are each s). The blue sub-pixel is located between the red sub-pixel and the green sub-pixel. Pixel units 2000 are arranged in an array in a plurality of rows and columns.

However, with this arrangement of the sub-pixels, the red and green sub-pixels are required to be narrower (i.e., the red and green sub-pixels are arranged to have a smaller width) for a product with a higher resolution, which results in a small aperture ratio of the display panel in the width direction (i.e., a direction of the width of the rectangular sub-pixel), adversely affecting the display effect of the display panel.

Aiming at the problem that the display panel has a small aperture ratio, the embodiment of the present disclosure provides the following technical solution.

Figure 3A:
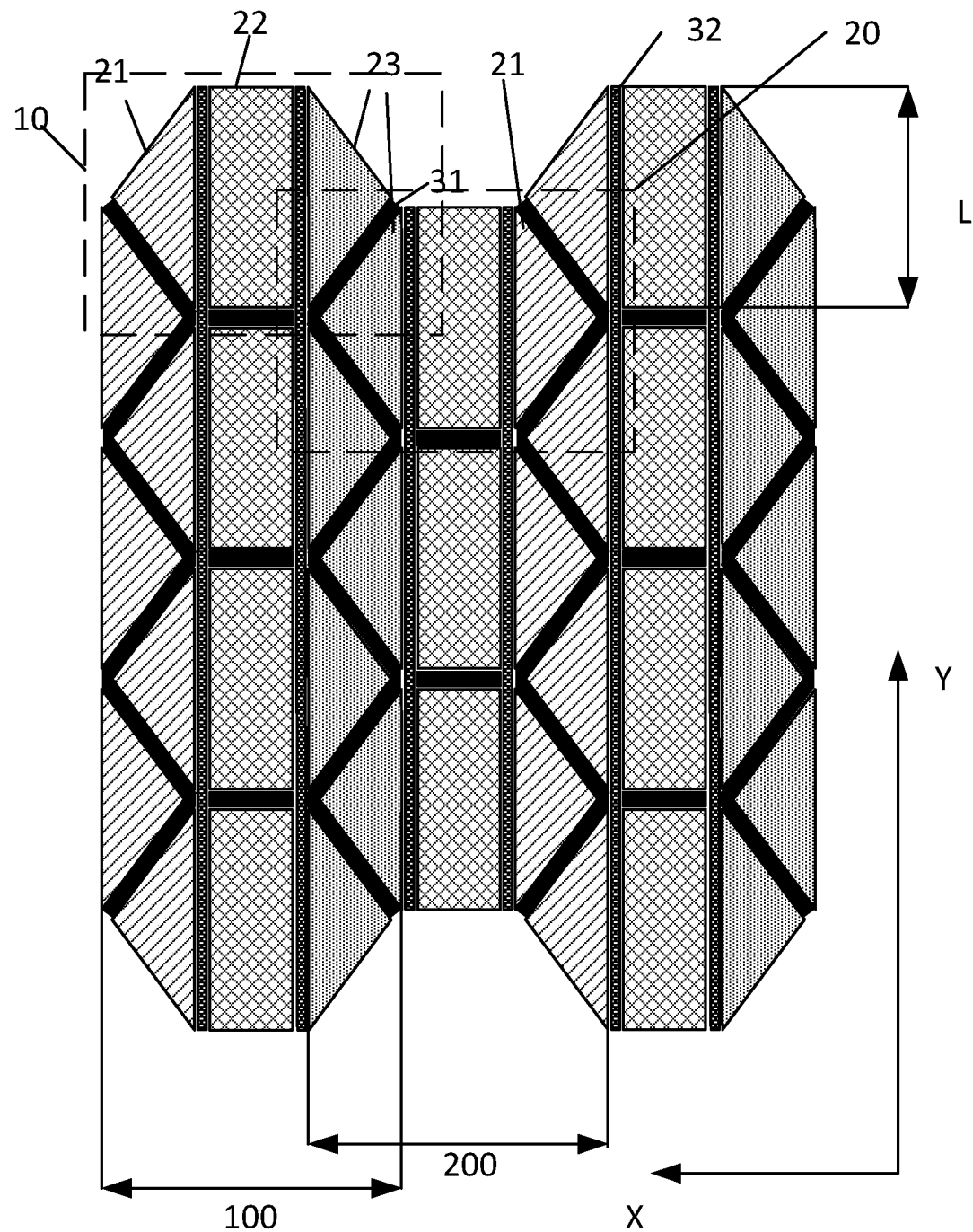
FIG. 3a is a schematic diagram of a structure of an array substrate according to an embodiment of the present disclosure.
Figure 3B:
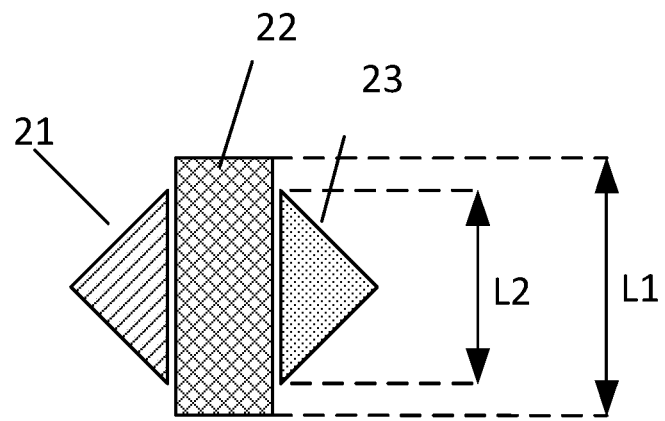
FIG. 3b is a schematic diagram of a structure of a pixel unit according to an embodiment of the present disclosure.
Figure 4A:
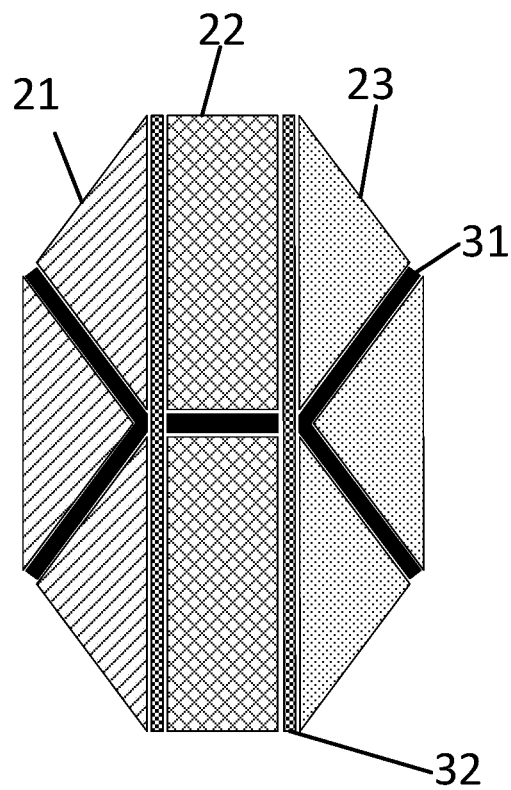
FIG. 4a is an enlarged schematic diagram of a structure of a part of an array substrate according to an embodiment of the present disclosure.
Figure 4B:
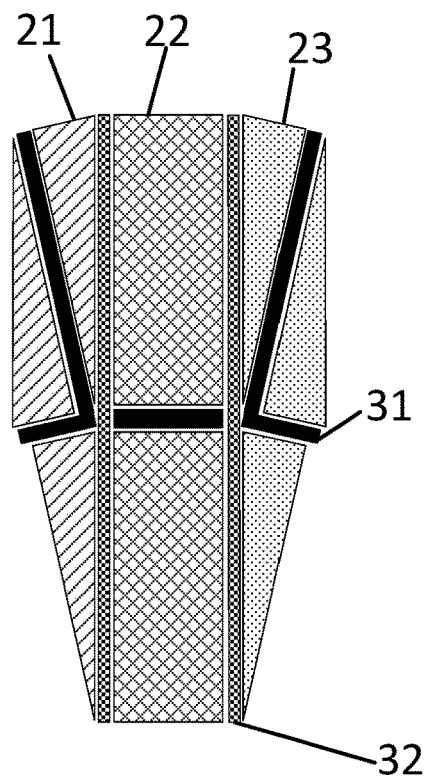
FIG. 4b is an enlarged schematic diagram of a structure of a part of an array substrate according to an embodiment of the present disclosure.
Figure 4C:
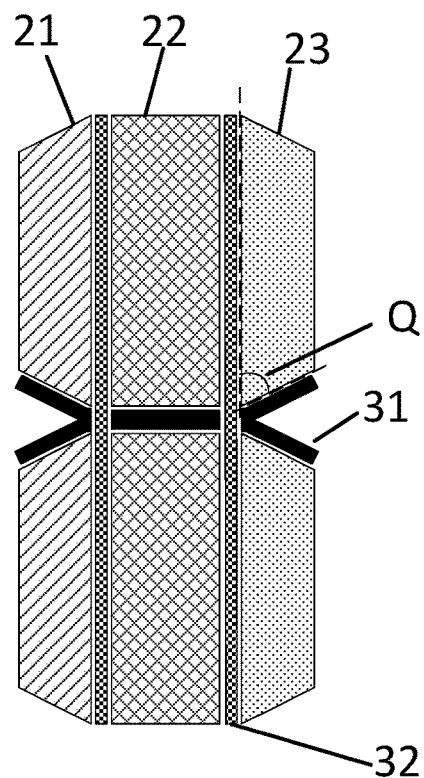
FIG. 4c is an enlarged schematic diagram of a structure of a part of an array substrate according to an embodiment of the present disclosure.
Figure 4D:
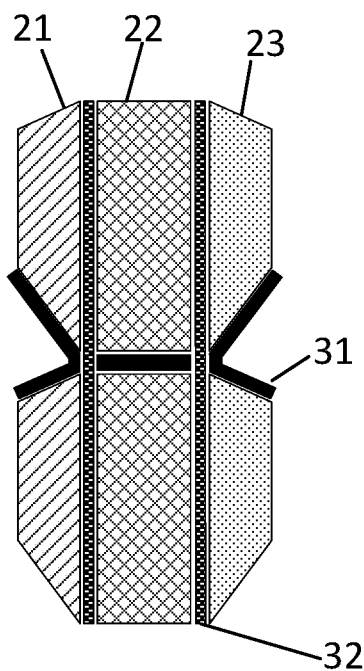
FIG. 4d is an enlarged schematic diagram of a structure of a part of an array substrate according to an embodiment of the present disclosure.
Figure 5:
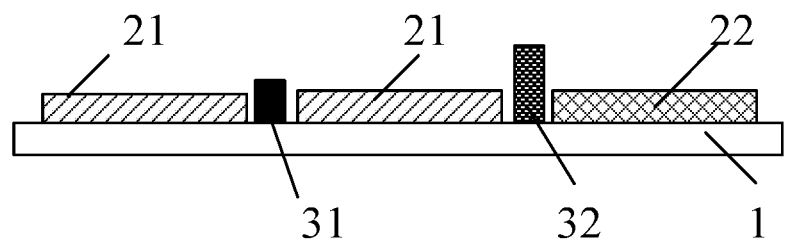
FIG. 5 is a schematic side view of a structure of an array substrate according to an embodiment of the present disclosure.
Figure 6:
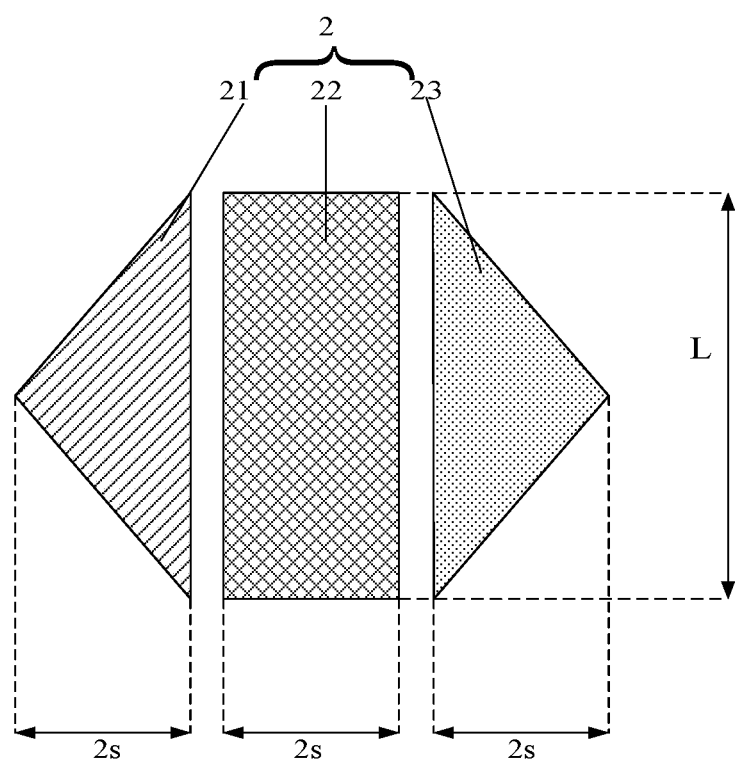
FIG. 6 is a schematic diagram of a structure of a pixel unit of an array substrate according to an embodiment of the present disclosure.

FIG. 3a is a schematic diagram of a structure of an array substrate according to an embodiment of the present disclosure; FIG. 3b is a schematic diagram of a structure of a pixel unit according to an embodiment of the present disclosure; FIG. 4a is an enlarged schematic diagram of a structure of a part of an array substrate according to an embodiment of the present disclosure; FIG. 4b is an enlarged schematic diagram of a structure of a part of an array substrate according to an embodiment of the present disclosure; FIG. 4c is an enlarged schematic diagram of a structure of a part of an array substrate according to an embodiment of the present disclosure; FIG. 4d is an enlarged schematic diagram of a structure of a part of an array substrate according to an embodiment of the present disclosure; FIG. 5 is a schematic side view of a structure of an array substrate according to an embodiment of the present disclosure; FIG. 6 is a schematic diagram of a structure of a pixel unit of an array substrate according to an embodiment of the present disclosure In a first aspect, as shown in FIGS. 3a to 7, the present embodiment provides an array substrate, including: a substrate 1, a plurality of pixel units 2, a plurality of first pixel defining layers 31, and a plurality of second pixel defining layers 32. The plurality of pixel units 2 are disposed on the substrate 1 and arranged in a plurality of rows and a plurality of columns. Each pixel unit 2 includes at least two sub-pixels of different colors, and each column of sub-pixels has the same color. In some embodiments of the present disclosure, each pixel unit includes at least one rectangular sub-pixel and at least one non-rectangular sub-pixel. In some embodiments of the present disclosure, the at least one non-rectangular sub-pixel has at least one first side disposed oppositely to at least one of a long side or a width of the at least one rectangular sub-pixel (specifically, parallel to and proximate to at least one of a long side or a width of the at least one rectangular sub-pixel), and an orthographic projection of the at least one non-rectangular sub-pixel on the first side thereof is located within the first side.

In some embodiments of the present disclosure, a length of the first side of the at least one non-rectangular sub-pixel is in a range from half of a length of the at least one of the long side or width of the at least one rectangular sub-pixel to the length of the at least one of the long side or width of the at least one rectangular sub-pixel. For example, as shown in FIG. 3b, the length of the at least one of the long side or width of the at least one rectangular sub-pixel is a first length L1; the length of the first side of the at least one non-rectangular sub-pixel is a second length L2; the second length L2 is equal to or greater than half of the first length L1 and equal to or less than the first length L1. For convenience of describing a relationship among sizes of the respective sub-pixels in one pixel unit, FIG. 3b shows only the respective sub-pixels, and does not show the first and second pixel defining layers 31 and 32.

The array substrate of FIG. 3a includes a plurality of columns of pixel units including a plurality of columns of first pixel units (a plurality of first pixel unit columns) 100 and a plurality of columns of second pixel units (a plurality of second pixel unit columns) 200. Each column of the first pixel units 100 of the plurality of columns of first pixel units 100 includes a plurality of first pixel units 10 sequentially arranged in a column direction, and each column of second pixel units 200 of the plurality of columns of second pixel units 200 includes a plurality of second pixel units 20 sequentially arranged in the column direction. In the first pixel unit column and second pixel unit column adjacent to each other, the first pixel unit and second pixel unit adjacent to each other are staggered (in a staggered manner) in a row direction. It does not necessarily distinguish the first and second pixel units 10 and 20 from each other, and thus, the first and second pixel units 10 and 20 may be collectively referred to as a pixel unit 2.

In some embodiments of the present disclosure, each of the first pixel unit 10 and the second pixel unit 20 includes at least two sub-pixels of different colors, the sub-pixels of different colors of the plurality of pixel units are arranged in a plurality of columns, and each column of sub-pixels has the same color. In some embodiments of the present disclosure, each of the first pixel unit 10 and the second pixel unit 20 includes one rectangular sub-pixel and at least one non-rectangular sub-pixel disposed on at least one of first and second sides of the rectangular sub-pixel opposite to each other in a row direction. As shown in FIG. 3a, each first pixel unit 10 includes, for example, one blue sub-pixel 22 at a middle position and one red sub-pixel 21 and one green sub-pixel 23 disposed at both sides of the blue sub-pixel 22; each second pixel unit 20 includes one blue sub-pixel 22 at a middle position and one green sub-pixel 23 and one red sub-pixel 21 disposed at both sides of the blue sub-pixel 22. As shown in FIG. 3a, in each first pixel unit 10, the red sub-pixel 21 is disposed on the first side of the blue sub-pixel 22 (the left side in the blue sub-pixel 22 as shown in FIG. 3a), and the green sub-pixel 23 is disposed on the second side of the blue sub-pixel 22 opposite to the first side (the right side in the blue sub-pixel 22 as shown in FIG. 3a); unlike the first pixel unit 10, in the second pixel unit 20, the green sub-pixel 23 is disposed on the first side (the left side) of the blue sub-pixel 22, and the red sub-pixel 21 is disposed on the second side (the right side) of the blue sub-pixel 22. In this way, sub-pixels of the same color, in a column of the first pixel unit 100 and a column of the second pixel unit 200 adjacent to each other, are adjacent to each other.

Specifically, as shown in FIG. 3a, in a column of first pixel units 100 and a column of second pixel units 200 adjacent to each other (for example, the leftmost column of first pixel units 100 and the middle column of second pixel units 200 shown in FIG. 3a), the adjacent first and second pixel units 10 and 20 are alternately arranged in the column direction (as shown in FIG. 3a, the first and second pixel units 10 and 20 are not disposed side by side in the row direction, but are shifted or staggered in the column direction by a distance of, for example, ½×L, that is, a difference between lengths in the column direction of the blue sub-pixels 22 in the adjacent first and second pixel units 10 and 20 is ½×L), so that the sub-pixels of the same color in the first and second pixel units 10 and 20 (for example, the green sub-pixels 23 in the leftmost column of first pixel units 100 and the middle column of second pixel units 200 shown in FIG. 3a) are alternately arranged in the column direction as a column of the sub-pixels, thereby arranging sub-pixels of the pixel units more closely, and thus improving the aperture ratio of the array substrate.

In the embodiment in FIG. 3a, the first pixel unit column 100 includes a plurality of first pixel units 10 arranged along the column direction (e.g., the Y direction shown in FIG. 3a), each of which includes the blue sub-pixel 22, the red sub-pixel 21, and the green sub-pixel 23. Each of the plurality of blue sub-pixels 22 in the plurality of first pixel units 10 is, for example, rectangular; each of the plurality of red sub-pixels 21 has a non-rectangular shape, such as a triangular shape shown in FIG. 3a or a trapezoidal shape shown in FIG. 4c or 4d; each of the plurality of green sub-pixels 23 has a non-rectangular shape, such as the triangular shape as shown in FIG. 3a or the trapezoidal shape as shown in FIG. 4c or 4d. As shown in FIG. 3a, the plurality of blue sub-pixels 22 are sequentially arranged along the column direction, the plurality of red sub-pixels 21 are sequentially arranged along the column direction, and the plurality of green sub-pixels 23 are sequentially arranged along the column direction. Similarly, each of the plurality of blue sub-pixels 22 in the plurality of second pixel units 20 is, for example, rectangular; each of the plurality of red sub-pixels 21 has a non-rectangular shape, such as the triangular shape shown in FIG. 3a or the trapezoidal shape shown in FIG. 4c or 4d; each of the plurality of green sub-pixels 23 has a non-rectangular shape, such as the triangular shape shown in FIG. 3a or the trapezoidal shape shown in FIG. 4c or 4d. As shown in FIG. 3a, the plurality of blue sub-pixels 22 are sequentially arranged along the column direction, the plurality of red sub-pixels 21 are sequentially arranged along the column direction, and the plurality of green sub-pixels 23 are sequentially arranged along the column direction. As shown in FIG. 3a, two sides of two triangles of two green sub-pixels 23 in the first pixel unit 10 and the second pixel unit 20 adjacent to each other are aligned to each other. For example, two sides of two triangles of two green sub-pixels 23 in the first pixel unit 10 and the second pixel unit 20 adjacent to each other are arranged at a constant interval, such that the plurality of green sub-pixels 23 of the plurality of first pixel units 10 in the column of first pixel units 100 and the plurality of green sub-pixels 23 of the plurality of second pixel units 20 in the column of second pixel units 100 adjacent to the column of first pixel units 100 are alternately arranged along a column direction.

As described above, the array substrate of the embodiment shown in FIG. 3a of the present disclosure includes the plurality of first pixel unit columns 100 and the plurality of second pixel unit columns 200 alternately arranged along the row direction (e.g., an X direction), i.e., any second pixel unit column 200 is arranged between two first pixel unit columns 100 adjacent to the second pixel unit column 200, and any first pixel unit column 100 is arranged between two second pixel unit columns 200 adjacent to the first pixel unit column 100. Thus, as shown in FIG. 3a, the second pixel unit column 200 is located between two first pixel unit columns 100 adjacent to the second pixel unit column 200, adjacent green sub-pixels 23 in one first pixel unit column 100 and one second pixel unit column 200 are arranged in one column, and adjacent sub-pixels in the second pixel unit column 200 and the other first pixel unit column 100 are red sub-pixels, which are arranged in one column. Thus, two pixel unit columns occupy 5 sub-columns (columns of sub-pixels). In this way, the layout of the array substrate is optimized while improving the aperture ratio of the array substrate.

Further, in some embodiments of the present disclosure, in the first pixel unit column and the second pixel unit column adjacent to each other, one leg of the first sub-pixel (having an isosceles triangle shape as shown in FIG. 3a) of each first pixel unit is arranged oppositely to a corresponding leg of the first sub-pixel (having an isosceles triangle shape as shown in FIG. 3a) of the adjacent second pixel unit, so that all the first sub-pixels in the first pixel unit column and the second pixel unit column adjacent to each other are arranged in one column, and an orthographic projection of the first pixel defining layers between the first sub-pixels on the substrate has a zigzag shape; in the first pixel unit column and the second pixel unit column adjacent to each other, one leg of the third sub-pixel (having an isosceles triangle shape as shown in FIG. 3a) of each first pixel unit is arranged oppositely to a corresponding leg of the third sub-pixel (having an isosceles triangle shape as shown in FIG. 3a) of the adjacent second pixel unit, so that all the third sub-pixels in the first pixel unit column and the second pixel unit column adjacent to each other are arranged in a column, and an orthographic projection of the first pixel defining layers between the third sub-pixels on the substrate has a zigzag shape. In this embodiment, in order to distinguish sub-pixels of the same color in different pixel units from each other, the first pixel defining layers 31 are provided between green sub-pixels 23 arranged in a column and between red sub-pixels 21 arranged in a column in different pixel units. For example, as shown in FIG. 3a, the array substrate includes the plurality of first pixel defining layers 31 extending substantially along the column direction, disposed between the sub-pixels of the same color in different pixel units (for example, between the red sub-pixels 21 of the adjacent first and second pixel units 10 and 20 and between the green sub-pixels 23 of the adjacent first and second pixel units 10 and 20), for separating different pixel units. As shown in FIG. 3a, the array substrate includes the plurality of first pixel defining layers 31 arranged in sequence along the row direction, and a shape of each first pixel defining layer 31 along the column direction may be adapted (conformal) to the shape of sub-pixels adjacent to the first pixel defining layer 31, thereby optimizing the layout of the array substrate. For example, each of the first pixel defining layers 31 shown in FIG. 3a is a zig-zag line extending in the column direction, which is disposed between two adjacent columns of red sub-pixels 21 or two adjacent columns of green sub-pixels 23, and is adapted to the shape of red sub-pixels 21 or green sub-pixels 23 adjacent to the first pixel defining layer 31, thereby optimizing the layout of the array substrate. Further, in some embodiments of the present disclosure, the array substrate further includes the plurality of first pixel defining layers 31 extending in the row direction, which are disposed between the blue sub-pixels 22 of the adjacent first pixel units 10; and between the blue sub-pixels 22 of adjacent second pixel units 20 for separating different pixel units.

Further, in this embodiment, in order to distinguish sub-pixels of different colors in the same pixel unit from each other, the array substrate includes the plurality of second pixel defining layers 32 extending in the column direction. For example, as shown in FIG. 3a, the array substrate includes the plurality of second pixel defining layers 32 extending substantially in the column direction, which are disposed between the sub-pixels of different colors (for example, between the red sub-pixel 21 and the blue sub-pixel 22 of the first pixel unit 10, between the red sub-pixel 21 and the blue sub-pixel 22 of the second pixel unit 20, between the green sub-pixel 23 and the blue sub-pixel 22 of the first pixel unit 10, or between the green sub-pixel 23 and the blue sub-pixel 22 of the second pixel unit 20), for separating the sub-pixels of different colors to avoid color mixing. As shown in FIG. 3a, the array substrate includes the plurality of second pixel defining layers 32 arranged in sequence along the row direction, and a shape of each second pixel defining layer 32 along the column direction may be adapted to a shape of sub-pixels adjacent to the second pixel defining layer 32, thereby optimizing the layout of the array substrate. For example, an orthographic projection of the second pixel defining layers 32 shown in FIG. 3a on the substrate is a substantially straight line extending along the column direction, which is arranged between the column of red sub-pixels 21 and the column of blue sub-pixels 22 adjacent to each other or between the column of blue sub-pixels 22 and the column of green sub-pixels 23 adjacent to each other, and is adapted to the shapes of the red sub-pixels 21, the blue sub-pixels 22 and the green sub-pixels 23 adjacent thereto, thereby optimizing the layout of the array substrate.

In the embodiment shown in FIG. 3a, the blue sub-pixel 22 in the first pixel unit 10 may be rectangular, and the red sub-pixel 21 and the green sub-pixel 23 may be triangular, and a length of a base of the triangle is approximately equal to that of a long side of the rectangle, for example, both are L. This arrangement causes the layout of the whole array substrate to be more compact, further improving the aperture ratio of the array substrate.

Unlike the embodiment shown in FIG. 3a, in the embodiment shown in FIG. 3b, the length of the long side of the rectangle of the blue sub-pixel 22 is greater than the length of the base of the triangle. For example, the length of the long side of the blue sub-pixel 22 is L1, while the length of the base of the triangle is L2, where L1 is greater than L2. L1 and L2 may be set as desired. For example, L1 and L2 may be set to $\frac{1}{2} \times L1 \leq L2 \leq L1$ as desired.

In some embodiments of the present disclosure, each first pixel defining layer 31 is located between any adjacent sub-pixels of the same color; each second pixel defining layer 32 is located between any adjacent sub-pixels of different colors; an angle between an extending direction of the at least one first pixel defining layer 31 and an extending direction of the at least one second pixel defining layer 32 is an acute angle (as indicated by an angle Q in FIGS. 4a to 4d).

It should be understood that the term "two sides being arranged (disposed) oppositely to each other" as used in this disclosure means that the two sides are parallel to each other and a distance between corresponding portions of the two sides is constant, which results in a constant thickness of the pixel defining layer between sub-pixels of the same color and a constant thickness of the pixel defining layer between sub-pixels of different colors. In some embodiments of the present disclosure, as shown in FIGS. 3a to 4d, the plurality of pixel units 2 are arranged in the plurality of rows and the plurality of columns to form a display structure of the array substrate. When an angle between the extending direction of the first pixel defining layer 31 and the extending direction of the second pixel defining layer 32 is an acute angle (i.e., when the extending direction of the first pixel defining layer 31 and the extending direction of the second pixel defining layer 32 intersect with each other and are not perpendicular to each other), and when the orthographic projection of the at least one non-rectangular sub-pixel on the first side thereof is located within the first side, shapes of the sub-pixels (each of the sub-pixel 21 and the sub-pixel 23 shown in FIGS. 4a to 4d) between the first pixel defining layer 31 and the second pixel defining layer 32 are non-rectangular, i.e., the shape of the at least one sub-pixel in each pixel unit 2 is non-rectangular. As shown in FIGS. 4a to 4d, an angle between the first pixel defining layer 31 and the second pixel defining layer 32 disposed around the rectangular sub-pixel 22 is a right angle. In other words, when the extending direction of the first pixel defining layer 31 and the extending direction of the second pixel defining layer 32 are at right angles therebetween (i.e., when the extending direction of the first pixel defining layer 31 and the extending direction of the second pixel defining layer 32 intersect with each other and are perpendicular to each other), the shape of the sub-pixel (the sub-pixel 22 shown in FIGS. 4a to 4d) between the first pixel defining layer 31 and the second pixel defining layer 32 is a rectangle.

In some embodiments of the present disclosure, the plurality of pixel units 2 are arranged in the plurality of rows and the plurality of columns. Each pixel unit 2 includes at least two sub-pixels of different colors, and each column of sub-pixels has a same color. In this way, corresponding sub-pixels in the plurality of pixel units 2 are also arranged in the plurality of rows and the plurality of columns, so that each column of sub-pixels has a same color.

It should be noted that, the sub-pixels of the array substrate in the related art are all rectangular. When the orthographic projection of the at least one non-rectangular sub-pixel on the first side is located within the first side, it is known from the common knowledge that, in non-rectangular and rectangular shapes having the same area, if long sides of the non-rectangular and rectangular shapes are equal to each other, a size of the non-rectangular shape is larger than that of the rectangular shape in a direction perpendicular to the long sides.

In the array substrate of the present embodiment, each pixel unit 2 has sub-pixels with a non-rectangular shape, that is, the rectangular sub-pixels in the related art are changed to having a non-rectangular shape, such that an area of the triangular or trapezoidal sub-pixel is equal to that of the original rectangular sub-pixel. In non-rectangular and rectangular shapes having the same area, if long sides of the non-rectangular and rectangular shapes are equal to each other, the size of the non-rectangular shape is larger than that of the rectangular shape in the direction perpendicular to the long sides, so that the aperture ratio of the array substrate of the present embodiment in the direction perpendicular to the long sides is larger than that of the array substrate of the related art under the condition of a constant resolution, thereby improving the display effect of the array substrate of the present embodiment, and forming the array substrate with a high resolution.

Specifically, each pixel unit includes at least one triangular or trapezoidal sub-pixel. That is, non-rectangular sub-pixels are triangular or trapezoidal.

It should be noted that the non-rectangular sub-pixels may have the isosceles triangle shape as shown in FIG. 4a, a non-isosceles triangle shape as shown in FIG. 4b, an isosceles trapezoidal shape as shown in FIG. 4c, a non-isosceles trapezoidal shape as shown in FIG. 4d, or other suitable shapes, which are not limited to the above examples.

In the pixel unit 2 of the present embodiment, each pixel unit 2 has a triangular or trapezoidal sub-pixel. That is, the rectangular sub-pixel in the related art is changed into a triangular or trapezoidal sub-pixel, which has an area equal to that of the original rectangular sub-pixel. In the triangle shape or trapezoidal shape and the rectangle shape with a same area, if a base of the triangle shape or trapezoidal shape is substantially equal to a long side of the rectangle shape, a height of the triangle shape or trapezoidal shape is greater than the width of the rectangle shape, so that the aperture ratio of the array substrate of the embodiment in a direction parallel to the height of the triangle or trapezoidal shape is greater than the aperture ratio in the array substrate in the related art, so that the display effect of the array substrate of the embodiment may be improved, and the array substrate with a high resolution may be formed.

In some embodiments of the present disclosure, as shown in FIG. 4a, each pixel unit includes at least one isosceles triangular sub-pixel.

It is to be noted that, as is known in the art, in a triangle and a rectangle having equal areas, if a base of the triangle is substantially equal to a long side of the rectangle, a height of the triangle is twice as large as the width of the rectangle.

In the array substrate of the present embodiment, each pixel unit 2 has a triangular sub-pixel. That is, the rectangular sub-pixel in the related art is changed into a triangular sub-pixel, which has an area equal to that of the original rectangular sub-pixel. In the triangle shape and the rectangle shape with a same area, if a base of the triangle shape is substantially equal to a long side of the rectangle shape, a height of the triangle shape is twice as large as the width of the rectangle shape, so that the aperture ratio of the array substrate of the embodiment in a direction parallel to the height of the triangle shape is greater than the aperture ratio in the array substrate in the related art, so that the display effect of the array substrate of the embodiment may be improved, and the array substrate with a high resolution may be formed.

It should be noted that the pixel unit 2 of the present embodiment may be an organic light emitting diode display unit, a liquid crystal display unit, or other types of display units. As an example, in the present embodiment, the pixel unit 2 is an organic light emitting diode display unit, that is, the array substrate of the present embodiment is an organic light emitting diode array substrate.

In some embodiments of the present disclosure, each of the pixel units 2 further includes a rectangular sub-pixel, a length of the base of the isosceles triangular sub-pixel is equal to a length of the long side of the rectangular sub-pixel, and the base of the isosceles triangular sub-pixel is parallel to one long side of the rectangular sub-pixel and is arranged closely to the long side.

In some embodiments of the present disclosure, each pixel unit 2 at least includes at least one isosceles triangular sub-pixel and one rectangular sub-pixel, and the at least one isosceles triangular sub-pixel and the rectangular sub-pixel have different colors from each other. That is, the at least one isosceles triangular sub-pixel and the rectangular sub-pixel may emit light with different colors from each other. The base of the isosceles triangular sub-pixel is parallel to one long side of the rectangular sub-pixel and arranged closely to the long side, so that the base of the isosceles triangular sub-pixel is closer to the long side of the rectangular sub-pixel than a vertex of the isosceles triangular sub-pixel.

In some embodiments of the present disclosure, a height of the isosceles triangular sub-pixel is equal to the width of the rectangular sub-pixel.

In some embodiments of the present disclosure, an area of the triangular sub-pixel is half of an area of the rectangular sub-pixel. However, the present disclosure is not limited thereto. In other embodiments of the present disclosure, the height of the triangular sub-pixel and the width of the rectangular sub-pixel may not be equal to each other, as long as the area of the triangular sub-pixel is smaller than the area of the rectangular sub-pixel.

In the embodiment of the present disclosure, as an example, the height of the triangular sub-pixel is equal to the width of the rectangular sub-pixel, and the area of the triangular sub-pixel is half of the area of the rectangular sub-pixel. However, the height of the triangular sub-pixel is equal to the width of the rectangular sub-pixel, and the area of the triangular sub-pixel is half of the area of the rectangular sub-pixel, which does not limit the protection scope of the embodiments of the present disclosure.

Specifically, as shown in FIG. 4a, each pixel unit 2 includes one first sub-pixel 21, one second sub-pixel 22, and one third sub-pixel 23, wherein the first sub-pixel 21 and the third sub-pixel 23 are isosceles triangles, and the second sub-pixel 22 is rectangular.

In some embodiments of the present disclosure, two isosceles triangular sub-pixels and one rectangular sub-pixel constitute one pixel unit 2, so as to realize display of the array substrate.

In some embodiments of the present disclosure, the second sub-pixel 22 is located between the base of the first sub-pixel 21 and the base of the third sub-pixel 23.

In some embodiments of the present disclosure, the base of the isosceles triangular first sub-pixel 21 and the base of the isosceles triangular third sub-pixel 23 are arranged opposite to each other, and the rectangular second sub-pixel 22 is located between the first sub-pixel 21 and the third sub-pixel 23 with two short side or two long sides of the rectangular second sub-pixel 22 arranged opposite to the base of the isosceles triangular first sub-pixel 21 and the base of the isosceles triangular third sub-pixel 23 respectively.

It should be noted that, as shown in FIG. 2, the first sub-pixel 210, the second sub-pixel 220, and the third sub-pixel 230 of each pixel unit 2000 in the related art are all rectangular, and are arranged in sequence, have long sides equal to each other, and the widths of the first sub-pixel 210 and the third sub-pixel 230 are smaller than the width of the second sub-pixel 220.

In the pixel unit 2 of the present embodiment, the shape of the first sub-pixel 21 and the shape of the third sub-pixel 23, which are rectangular as shown in FIG. 2, are shaped as triangles so that the maximum size of the whole pixel unit 2 in a width direction of the second sub-pixel 22 is greater than the maximum size of the pixel unit 2000 in the related art in a width direction of the second sub-pixel 220. Specifically, the maximum size of the whole pixel unit 2 is 1.5 times the corresponding size of the pixel unit 2000 in the related art. Such designed pixel unit 2 of the present embodiment may increase the aperture ratio of the array substrate of the present embodiment in the width direction of the second sub-pixel 22, and further may improve the display effect of the array substrate of the present embodiment, and may form an array substrate with a high resolution.

For example, as shown in FIG. 6, a height of the first sub-pixel 21 and a height of the third sub-pixel 23 is 2s, a base of the first sub-pixel 21 and a base of the third sub-pixel 23 is L; the second sub-pixel 22 has a width of 2s, and a long side of L, so that the maximum size of the whole pixel unit 2 in a width direction of the second sub-pixel 22 is 6s; and in the related art, as shown in FIG. 2, the maximum size of the whole pixel unit 2000 in a width direction of the second sub-pixel 220 is 4s. Therefore, the maximum size 6s of the pixel unit 2 of the present embodiment in the width direction of the second sub-pixel 22 is greater than the corresponding size 4s of the pixel unit 2000 in the related art.

In some embodiments of the present disclosure, the base of each of the first sub-pixel 21 and the third sub-pixel 23 is in a range of L/2 to L. However, the present disclosure is not limited thereto. The base of each of the first sub-pixel 21 and the third sub-pixel 23 is in the range of L/2 to L, which does not limit the scope of the embodiments of the present disclosure, as long as the area of the triangular sub-pixel is smaller than the area of the rectangular sub-pixel.

In some embodiments of the present disclosure, the first sub-pixel 21 is a red sub-pixel (R), the second sub-pixel 22 is a blue sub-pixel (B), and the third sub-pixel 23 is a green sub-pixel (G). In the embodiment of the present disclosure, as an example, the first sub-pixel is the red sub-pixel, the second sub-pixel is the green sub-pixel, and the third sub-pixel is the blue sub-pixel. However, the first sub-pixel is the red sub-pixel, the second sub-pixel is the green sub-pixel, and the third sub-pixel is the blue sub-pixel, which does not limit the scope of the embodiments of the present disclosure.

In some embodiments of the present disclosure, the red and green sub-pixels are triangular, the blue sub-pixel is rectangular, and an area of each of the red and green sub-pixels is smaller than an area of the blue sub-pixel. The efficiency and lifetime of the blue light emitting material of the blue sub-pixel are lower than those of the red light emitting material of the red sub-pixel and the green light emitting material of the green sub-pixel, so such a designed blue sub-pixel has a larger area to compensate for the deficiency of the blue light emitting material.

Specifically, in the pixel unit 2 of the present embodiment, the shape of the red sub-pixel and the shape of the green sub-pixel are shaped as triangles so that the maximum size of the whole pixel unit 2 in a width direction of the blue sub-pixel is greater than the maximum size of the pixel unit 2000 in the related art in a width direction of the blue sub-pixel. Specifically, the maximum size of the whole pixel unit 2 is 1.5 times the corresponding size of the pixel unit 2000 in the related art. Such a designed pixel unit 2 of the present embodiment may increase the aperture ratio of the array substrate of the present embodiment in the width direction of the blue sub-pixel, and further may improve the display effect of the array substrate of the present embodiment, and may form an array substrate with a high resolution.

In some embodiments of the present disclosure, in any two adjacent columns of pixel units 2, any one of the first sub-pixels 21 in one column of pixel units 2 is between legs of two adjacent first sub-pixels 21 in the other column of pixel units 2, and/or any one of the third sub-pixels 23 in one column of pixel units 2 is between legs of two adjacent third sub-pixels 23 in the other column of pixel units 2.

In some embodiments of the present disclosure, as shown in FIGS. 3a and 4a, in the pixel unit 2 of which the first sub-pixel 21 and the third sub-pixel 23 each have an isosceles triangle shape, the third sub-pixel 23 of any one pixel unit 2 in the second column of pixel units 2 is located between the third sub-pixels 23 of the corresponding two pixel units 2 in the first column of pixel units 2; and the first sub-pixel 21 of any one pixel unit 2 of the second column of pixel units 2 is located between the first sub-pixels 21 of the corresponding two pixel units 2 of the third column of pixel units 2. One first sub-pixel 21 is arranged between the first sub-pixels 21 of any two adjacent pixel units 2 in the first column of pixel units 2. In this way, as shown in FIG. 3a, all the first sub-pixels 21 of the pixel units 2 in the adjacent columns form one column of the first sub-pixels 21, all the third sub-pixels 23 of the pixel units 2 in the adjacent columns form one column of the third sub-pixels 23, and all the second sub-pixels 22 of each column of the pixel units 2 form one column of the second sub-pixels 22, so that each column of the sub-pixels has a same color, i.e., each column of the sub-pixels emits light of the same color. In some embodiments of the present disclosure, legs of any two adjacent first sub-pixels 21 in each column of first sub-pixels 21 are disposed oppositely to each other, and legs of any two adjacent third sub-pixels 23 in each column of third sub-pixels 23 are disposed opposite to each other.

In some embodiments of the present disclosure, as shown in FIG. 3a, the pixel units 2 of two adjacent columns are arranged in a staggered manner in the column direction, and the first sub-pixels 21 and the third sub-pixels 23 of the pixel units 2 of the odd columns are opposite to the first sub-pixels 21 and the third sub-pixels 23 of the pixel units 2 of the even columns (for example, as shown in FIG. 3a, along the width direction of the rectangular second sub-pixel 22, each pixel unit 2 in the first column of the pixel units 2 and each pixel unit 2 in the third column of the pixel units 2 respectively include one first sub-pixel 21, one second sub-pixel 22 and one third sub-pixel 23 which are arranged in sequence, and each pixel unit 2 in the second column of the pixel units 2 includes one third sub-pixel 23, one second sub-pixel 22 and one first sub-pixel 21 which are arranged in sequence), so that the plurality of columns of the pixel units 2 are arranged more closely.

In some embodiments of the present disclosure, the plurality of first pixel defining layers 31 between any two adjacent first sub-pixels 21 in each column of the first sub-pixels 21 have a one-piece structure; the plurality of first pixel defining layers 31 between any two adjacent third sub-pixels 23 in each column of the third sub-pixels 23 have a one-piece structure; the plurality of second pixel defining layers 32 between each column of first sub-pixels 21 and each column of second sub-pixels 22 have a one-piece structure; the plurality of second pixel defining layers 32 between each column of third sub-pixels 23 and each column of second sub-pixels 22 have a one-piece structure; the plurality of first pixel defining layers 31 further include a first pixel defining layer 31 between any two adjacent second sub-pixels 22; an extending direction of each of the plurality of first pixel defining layers 31 between any two adjacent first sub-pixels 21 in each column of the first sub-pixels 21 is at an acute angle with an extending direction of each of the plurality of second pixel defining layers 32 between each column of the first sub-pixels 21 and each column of the second sub-pixels 22; an extending direction of each of the plurality of first pixel defining layers 31 between any two adjacent third sub-pixels 23 in each column of the third sub-pixels 23 is at an acute angle with an extending direction of each of the plurality of second pixel defining layers 32 between each column of the third sub-pixels 23 and each column of the second sub-pixels 22.

In some embodiments of the present disclosure, as shown in FIGS. 3a and 4a, in the pixel unit 2 of which the first sub-pixel 21 and the third sub-pixel 23 have an isosceles triangle shape, the first pixel defining layers 31 are disposed between any adjacent first sub-pixels 21, and have a one-piece structure; the first pixel defining layers 31 are disposed between any adjacent second sub-pixels 22; the first pixel defining layers 31 are disposed between any adjacent third sub-pixels 23, and have a one-piece structure; the second pixel defining layers 32 are disposed between each column of the first sub-pixels 21 and each column of the second sub-pixels 22, and have a one-piece structure; the second pixel defining layers 32 are disposed between each column of the second sub-pixels 22 and each column of the third sub-pixels 23, and have a one-piece structure; the second pixel defining layers 32 between each column of the first sub-pixels 21 and each column of the second sub-pixels 22 and the second pixel defining layers 32 between each column of the second sub-pixels 22 and each column of the third sub-pixels 23 are parallel to each other; an angle between an extending direction of the first pixel defining layer 31 disposed between the adjacent first sub-pixels 21 and an extending direction of the second pixel defining layer 32 disposed between the first sub-pixel 21 and the second sub-pixel 22 is an acute angle (as indicated by an angle Q in FIGS. 4a to 4d); an angle between an extending direction of the first pixel defining layer 31 disposed between the adjacent third sub-pixels 23 and an extending direction of the second pixel defining layer 32 disposed between the second sub-pixel 22 and the third sub-pixel 23 is an acute angle (as indicated by an angle Q in FIGS. 4a to 4d); an angle between an extending direction of the first pixel defining layer 31 disposed between the adjacent third sub-pixels 23 and an extending direction of the second pixel defining layer 32 disposed between the third sub-pixel 23 and the second sub-pixel 22 is an acute angle (as indicated by an angle Q in FIGS. 4a to 4d); an angle between an extending direction of the first pixel defining layer 31 disposed between the adjacent third sub-pixels 23 and an extending direction of the second pixel defining layer 32 disposed between the second sub-pixel 22 and the third sub-pixel 23 is an acute angle (as indicated by an angle Q in FIGS. 4a to 4d).

In some embodiments of the present disclosure, as shown in FIGS. 3a and 4a, in the pixel unit 2 of which the first sub-pixel 21 and the third sub-pixel 23 have an isosceles triangle shape, a height of the isosceles triangular sub-pixel (each of the first sub-pixel 21 and the third sub-pixel 23) is in a range of 10 micrometers to 100 micrometers; a base of the isosceles triangular sub-pixel (each of the first sub-pixel 21 and the third sub-pixel 23) is in a range of 50 micrometers to 200 micrometers; a long side of the rectangular sub-pixel (the second sub-pixel 22) has a same length as the base of the isosceles triangular sub-pixel, and is therefore also in a range of 50 micrometers to 200 micrometers; a width of the rectangular sub-pixel (the second sub-pixel 22) is in a range of 10 micrometers to 100 micrometers.

As shown in FIG. 4c, each of the pixel units 2 includes one first sub-pixel 21, one second sub-pixel 22 and one third sub-pixel 23, the first sub-pixel 21 and the third sub-pixel 23 have an isosceles trapezoidal shape, and the second sub-pixel 22 is rectangular; the second sub-pixel 22 is located between a lower base of the first sub-pixel 21 and a lower base of the third sub-pixel 23. A length of the lower base of the first sub-pixel 21 and a length of the lower base of the third sub-pixel 23 are equal to a length of the long side of the second sub-pixel 22, and the lower base of the first sub-pixel 21 and the lower base of the third sub-pixel 23 are arranged in parallel to one long side of the second sub-pixel 22 and close to the long side.

In some embodiments of the present disclosure, as shown in FIGS. 4a to 4d and 5, a distance of a top surface of the first pixel defining layer 31 from the substrate 1 is smaller than that of a top surface of the second pixel defining layer 32 from the substrate 1; the top surface is a surface of a pixel defining layer (the first pixel defining layer 31 or the second pixel defining layer 32) farthest from the substrate 1. In other words, a thickness of the first pixel defining layer 31 is smaller than that of the second pixel defining layer 32.

The array substrate further includes a hole injection layer HIL, a hole transport layer HTL, a quantum dot layer EML, an electron transport layer ETL, an electron injection layer EIL and the like which are sequentially stacked, and finally the complete sub-pixel is formed. Therefore, the pixel defining layer is arranged between the sub-pixels, so that the phenomenon of mutual interference between the adjacent sub-pixels may be avoided in the process of preparing the sub-pixels, and the performance of the array substrate is ensured.

Because the materials for forming the sub-pixels of different colors are different, in order to avoid the mutual interference between the sub-pixels of different colors in the process of preparing the sub-pixels, the second pixel defining layers 32 between the sub-pixels of different colors are necessarily formed to have a greater height; since the sub-pixels of a same color are formed of the same material, the first pixel defining layers 31 between the sub-pixels of a same color may be formed to have a small height, such that each first pixel defining layer 31 is lower than each second pixel defining layer 32.

Figure 7:
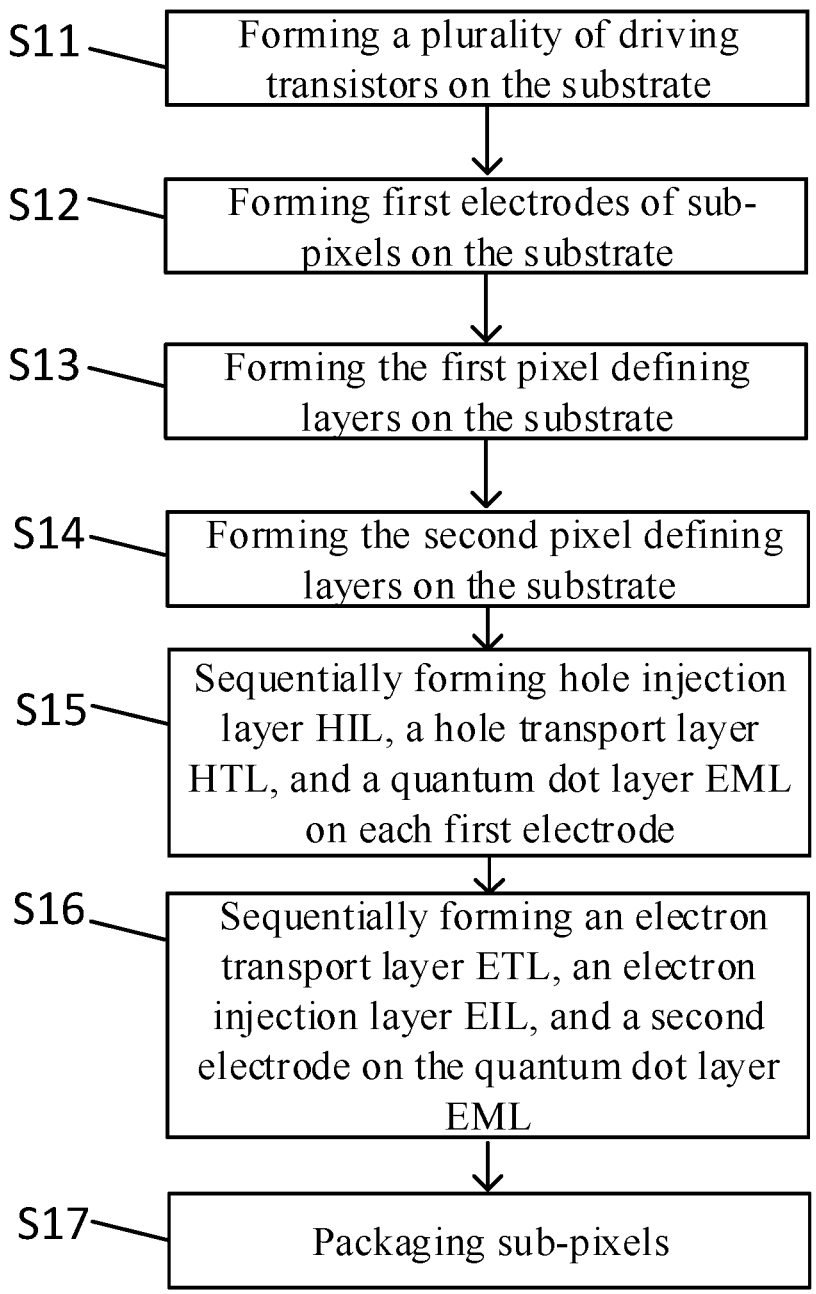
FIG. 7 is a schematic flowchart of a method for manufacturing an array substrate according to an embodiment of the present disclosure.

FIG. 7 is a schematic flowchart of a method for manufacturing an array substrate according to an embodiment of the present disclosure. In a second aspect, as shown in FIG. 7, this embodiment provides a method for manufacturing an array substrate, including: step S11 to step S17.

In step S11, a plurality of driving transistors are formed on the substrate 1; the driving transistor may be used for driving sub-pixels formed later to emit light.

In step S12, first electrodes of sub-pixels are formed on the substrate 1.

In step S13, the first pixel defining layers 31 are formed on the substrate 1.

The first pixel defining layers 31 may not only cover edges of the first electrodes to prevent the first electrodes from leaking electricity, but also allow the materials (such as inks) for forming sub-pixels of the same color in each column to communicate with each other due to a relatively small thickness of each first pixel defining layer 31.

In step S14, the second pixel defining layers 32 are formed on the substrate 1.

In some embodiments of the present disclosure, the second pixel defining layers 32 may prevent interference between the inks for forming sub-pixels of different colors, i.e., prevent the ink from overflowing into the adjacent sub-pixels of different colors.

In step S15, a hole injection layer HIL, a hole transport layer HTL, and a quantum dot layer EML are sequentially formed on each first electrode.

In step S16, an electron transport layer ETL, an electron injection layer EIL, and a second electrode are sequentially formed on the quantum dot layer EML, and finally a complete sub-pixel is formed.

In some embodiments of the present disclosure, the second electrode may be formed by using an evaporation method. Note that sub-pixels are generally formed by using an ink jet printing technology.

In step S17, sub-pixels are packaged to form an array substrate.

In the array substrate of the present embodiment, each pixel unit 2 has a triangular sub-pixel. That is, the rectangular sub-pixel in the related art is changed into a triangular sub-pixel, which has an area equal to that of the original rectangular sub-pixel. In the triangle shape and the rectangle shape with a same area, if a base of the triangle shape is substantially equal to a long side of the rectangle shape, a height of the triangle shape is twice as large as the width of the rectangle shape, so that the aperture ratio of the array substrate of the embodiment in a direction parallel to the height of the triangle shape is greater than the aperture ratio in the array substrate in the related art, so that the display effect of the array substrate of the embodiment may be improved, and the array substrate with a high resolution may be formed.

Specifically, as shown in FIGS. 3a and 4a, each pixel unit 2 includes one first sub-pixel 21, one second sub-pixel 22, and one third sub-pixel 23, and the shape of the first sub-pixel 21 and the shape of the third sub-pixel 23 are isosceles triangles, and the shape of the second sub-pixel 22 is a rectangle.

Compared with the pixel unit 2000, in which the first sub-pixel 210 and the third sub-pixel 230 are rectangular, in the related art as shown in FIG. 2, in the pixel unit 2 of the present embodiment, the shape of the first sub-pixel 21 and the shape of the third sub-pixel 23 are shaped as triangles so that the maximum size of the whole pixel unit 2 in a width direction of the second sub-pixel 22 is greater than the maximum size of the pixel unit 2000 in the related art in a width direction of the second sub-pixel 220. Specifically, the maximum size of the whole pixel unit 2 is 1.5 times the corresponding size of the pixel unit 2000 in the related art. Such designed pixel unit 2 of the present embodiment may increase the aperture ratio of the array substrate of the present embodiment in the width direction of the second sub-pixel 22, and further may improve the display effect of the array substrate of the present embodiment, and may form an array substrate with a high resolution.

For example, as shown in FIG. 6, a height of the first sub-pixel 21 and a height of the third sub-pixel 23 each is 2s, a base of the first sub-pixel 21 and a base of the third sub-pixel 23 is L; the second sub-pixel 22 has a width of 2s, and a long side of L, so that the maximum size of the whole pixel unit 2 in a width direction of the second sub-pixel 22 is 6s; and in the related art, as shown in FIG. 2, the maximum size of the whole pixel unit 2000 in a width direction of the second sub-pixel 220 is 4s. Therefore, the maximum size 6s of the pixel unit 2 of the present embodiment in the width direction of the second sub-pixel 22 is greater than the corresponding size 4s of the pixel unit 2000 in the related art.

In some embodiments of the present disclosure, the first sub-pixel 21 is a red sub-pixel, the second sub-pixel 22 is a blue sub-pixel, and the third sub-pixel 23 is a green sub-pixel.

In some embodiments of the present disclosure, the red and green sub-pixels are triangular, the blue sub-pixel is rectangular, and an area of each of the red and green sub-pixels is smaller than an area of the blue sub-pixel. The efficiency and lifetime of the blue light emitting material of the blue sub-pixel are lower than those of the red light emitting material of the red sub-pixel and the green light emitting material of the green sub-pixel, so such a designed blue sub-pixel has a larger area to compensate for the deficiency of the blue light emitting material.

Specifically, in the pixel unit 2 of the present embodiment, the shape of the red sub-pixel and the shape of the green sub-pixel are shaped as triangles so that the maximum size of the whole pixel unit 2 in a width direction of the blue sub-pixel is greater than the maximum size of the pixel unit 2000 in the related art in a width direction of the blue sub-pixel. Specifically, the maximum size of the whole pixel unit 2 is 1.5 times the corresponding size of the pixel unit 2000 in the related art. Such a designed pixel unit 2 of the present embodiment may increase the aperture ratio of the array substrate of the present embodiment in the width direction of the blue sub-pixel, and further may improve the display effect of the array substrate of the present embodiment, and may form an array substrate with a high resolution.

In some embodiments of the present disclosure, the plurality of first pixel defining layers 31 between any two adjacent first sub-pixels 21 in each column of the first sub-pixels 21 are formed to have a one-piece structure; the plurality of first pixel defining layers 31 between any two adjacent third sub-pixels 23 in each column of the third sub-pixels 23 are formed to have a one-piece structure; the plurality of second pixel defining layers 32 between each column of first sub-pixels 21 and each column of second sub-pixels 22 are formed to have a one-piece structure; the plurality of second pixel defining layers 32 between each column of third sub-pixels 23 and each column of second sub-pixels 22 are formed to have a one-piece structure; In a third aspect, the present embodiment provides a display panel including an array substrate described herein or manufactured by the method described herein.

Specifically, the display panel may be any product or component with a display function, such as electronic paper, a mobile phone, a tablet computer, a television, a display, a notebook computer, a digital photo frame, a navigator and the like.

In some embodiments of the present disclosure, each pixel unit 2 in the display panel includes: one red sub-pixel, one blue sub-pixel, and one green sub-pixel. The red sub-pixel and the green sub-pixel are triangular, the blue sub-pixel is rectangular, and an area of the red sub-pixel and an area of the green sub-pixel both are smaller than that of the blue sub-pixel.

In the pixel unit 2 of the present embodiment, the shape of the red sub-pixel and the shape of the green sub-pixel are shaped as triangles so that the maximum size of the whole pixel unit 2 in a width direction of the blue sub-pixel is greater than the maximum size of the pixel unit 2000 in the related art in a width direction of the blue sub-pixel. Specifically, the maximum size of the whole pixel unit 2 is 1.5 times the corresponding size of the pixel unit 2000 in the related art. Such a designed pixel unit 2 of the present embodiment may increase the aperture ratio of the array substrate of the present embodiment in the width direction of the blue sub-pixel, and further may improve the display effect of the array substrate of the present embodiment, and may form an array substrate with a high resolution.

It should be noted that, in the present disclosure, the terms such as first, second, and the like are used solely for distinguishing one entity or action from another entity or action without necessarily requiring or implying any actual such relationship or order between such entities or actions. Further, the term of "including", "comprising", or any other variation thereof, are intended to cover a non-exclusive inclusion, such that a process, method, article, or apparatus having a list of elements has not only those elements but also may have other elements not expressly listed or inherent to such process, method, article, or apparatus. Without further limitation, an element defined by the phrase "comprising (or including) a . . . " does not exclude the presence of other identical elements in the process, method, article, or apparatus having the element.

In accordance with the foregoing description of the disclosed embodiments, these embodiments are not intended to be exhaustive or to limit a claimed invention to the precise embodiments disclosed herein. Obviously, many modifications and variations are possible in light of the foregoing description. The embodiments are chosen and described in detail in order to best explain the principles of the present disclosure and a practical application, to thereby enable one of ordinary skill in the art to best utilize the present disclosure and various embodiments with various modifications as are suited to the particular use contemplated. The present disclosure is to be limited only by the appended claims, their full scope and equivalents.

The invention claimed is:

1. An array substrate, comprising:
a substrate; and
a plurality of pixel units on the substrate and arranged in a plurality of columns,
wherein the plurality of pixel units comprise a plurality of first pixel unit columns and a plurality of second pixel unit columns alternately arranged in a row direction; each of the plurality of first pixel unit columns comprises a plurality of first pixel units sequentially arranged in a column direction; each of the plurality of second pixel unit columns comprises a plurality of second pixel units sequentially arranged in the column direction; first pixel units and second pixel units adjacent to each other are staggered in the row direction in a first pixel unit column and a second pixel unit column adjacent to each other,
wherein each of the first pixel unit and the second pixel unit comprises at least two sub-pixels of different colors, the sub-pixels of different colors of the plurality of pixel units are arranged in a plurality of columns, and each column of the sub-pixels has a same color;
at least two sub-pixels of different colors comprise one rectangular sub-pixel and at least one non-rectangular sub-pixel on at least one of first and second sides of the rectangular sub-pixel opposite to each other in the row direction, and
each of the at least one non-rectangular sub-pixel has a first side opposite to at least one of a long side or a width of the rectangular sub-pixel, and an orthographic projection of the at least one non-rectangular sub-pixel on the long side or the width of the rectangular sub-pixel is within the long side or the width.

2. The array substrate of claim 1, wherein
each of the first pixel unit and the second pixel unit comprises a first sub-pixel, a second sub-pixel and a third sub-pixel;
the second sub-pixel is the rectangular sub-pixel, the at least one non-rectangular sub-pixel comprises two non-rectangular sub-pixels, and the first sub-pixel and the third sub-pixel are the non-rectangular sub-pixels;
in the first pixel unit, the first and third sub-pixels are at first and second sides of the second sub-pixel, respectively; and
in the second pixel unit, the third sub-pixel and the first sub-pixel are at first and second sides of the second sub-pixel, respectively.

3. The array substrate of claim 2, wherein
a plurality of second sub-pixels in each of the plurality of first pixel unit columns are sequentially arranged along the column direction;
a plurality of second sub-pixels in each of the plurality of second pixel unit columns are sequentially arranged along the column direction;
in first and second pixel unit columns adjacent to each other arranged in the row direction, two third sub-pixels of any adjacent first and second pixel units have opposite sides, and a plurality of third sub-pixels of the plurality of first pixel units and a plurality of third sub-pixels of the plurality of second pixel units are alternately arranged in the column direction; and
in second and first pixel unit columns adjacent to each other arranged in the row direction, two first sub-pixels of any adjacent second and first pixel units have opposite sides, and a plurality of first sub-pixels of the plurality of first pixel units and a plurality of first sub-pixels of the plurality of second pixel units are alternately arranged in the column direction.

4. The array substrate of claim 1, further comprising:
a plurality of first pixel defining layers, each of which is between any adjacent sub-pixels of the same color; and
a plurality of second pixel defining layers, each of which is between any adjacent sub-pixels of different colors,
wherein an angle between an extending direction of at least one of the plurality of first pixel defining layers and an extending direction of at least one of the plurality of second pixel defining layers is an acute angle.

5. The array substrate of claim 4, wherein the at least one non-rectangular sub-pixel each is a triangular or trapezoidal sub-pixel.

6. The array substrate of claim 5, wherein
the at least one non-rectangular sub-pixel comprises at least one isosceles triangular sub-pixel, and
a length of a base of the isosceles triangular sub-pixel is equal to a length of the long side of the rectangular sub-pixel; and the base of the isosceles triangular sub-pixel is opposite to one long side of the rectangular sub-pixel.

7. The array substrate of claim 6, wherein the isosceles triangular sub-pixel has a height equal to the width of the rectangular sub-pixel.

8. The array substrate of claim 6, wherein
each of the first pixel unit and the second pixel unit comprises one first sub-pixel, one second sub-pixel, and one third sub-pixel, the at least one isosceles triangular sub-pixel comprises the first sub-pixel and the third sub-pixel, the rectangular sub-pixel comprises the second sub-pixel,
in first and second pixel unit columns adjacent to each other, one leg of the first sub-pixel of each first pixel unit is opposite to a corresponding leg of the first sub-pixel of the second pixel unit adjacent to the first pixel unit, so that all the first sub-pixels in first and second pixel unit columns adjacent to each other are arranged in a column, and an orthographic projection of the first pixel defining layers between the first sub-pixels on the substrate has a zigzag shape;
in first and second pixel unit columns adjacent to each other, one leg of the third sub-pixel of each first pixel unit is opposite to a corresponding leg of the third sub-pixel of the second pixel unit adjacent to the first pixel unit, so that all the third sub-pixels in first and second pixel unit columns adjacent to each other are arranged in a column, and an orthographic projection of the first pixel defining layers between the third sub-pixels on the substrate has a zigzag shape; and
in first and second pixel unit columns adjacent to each other, the first and second pixel units adjacent to each other are spaced apart from each other in the column direction by a distance equal to half of a length of the long side of the rectangular second sub-pixel.

9. The array substrate of claim 8, wherein in each of the first pixel unit and the second pixel unit, the second sub-pixel is between a base of the first sub-pixel and a base of the third sub-pixel.

10. The array substrate of claim 8, wherein the first sub-pixel is a red sub-pixel, the second sub-pixel is a blue sub-pixel, and the third sub-pixel is a green sub-pixel.

11. The array substrate of claim 9, wherein
the plurality of first pixel defining layers between any two adjacent first sub-pixels in each column of the first sub-pixels have a one-piece structure;
the plurality of first pixel defining layers between any two adjacent third sub-pixels in each column of the third sub-pixels have a one-piece structure;
the plurality of second pixel defining layers between each column of first sub-pixels and each column of second sub-pixels have a one-piece structure, such that an orthographic projection of the plurality of second pixel defining layers on the substrate is a straight line;
the plurality of second pixel defining layers between each column of third sub-pixels and each column of second sub-pixels have a one-piece structure, such that an orthographic projection of the plurality of second pixel defining layers on the substrate is a straight line;
the plurality of first pixel defining layers further comprise a first pixel defining layer between any two adjacent second sub-pixels of each column of second sub-pixels;
the extending direction of each of the plurality of first pixel defining layers between any two adjacent first sub-pixels in each column of first sub-pixels is at an acute angle with the extending direction of each of the plurality of second pixel defining layers between each column of the first sub-pixels and each column of the second sub-pixels; and
the extending direction of each of the plurality of first pixel defining layers between any two adjacent third sub-pixels in each column of third sub-pixels is at an acute angle with the extending direction of each of the plurality of second pixel defining layers between each column of the third sub-pixels and each column of the second sub-pixels.

12. The array substrate of claim 6, wherein
a height of the isosceles triangular sub-pixel is in a range of 10 micrometers to 100 micrometers, and a length of the base of the isosceles triangular sub-pixel is in a range of 50 micrometers to 200 micrometers; and
a length of the long side of the rectangular sub-pixel is in a range of 50 micrometers to 200 micrometers and a length of the width of the rectangular sub-pixel in a range of 10 micrometers to 100 micrometers.

13. The array substrate of claim 5, wherein
the at least one non-rectangular sub-pixel comprises at least one isosceles trapezoidal sub-pixel, and
a length of a lower base of the isosceles trapezoidal sub-pixel is equal to a length of the long side of the rectangular sub-pixel, and the lower base of the isosceles trapezoidal sub-pixel is opposite to one long side of the rectangular sub-pixel.

14. The array substrate of claim 13, wherein
each of the first pixel unit and the second pixel unit comprises one first sub-pixel, one second sub-pixel and one third sub-pixel, the at least one non-rectangular sub-pixel comprises at least one isosceles trapezoidal sub-pixel, which comprises the first sub-pixel and the third sub-pixel, and the rectangular sub-pixel comprises the second sub-pixel; and
in each of the first pixel unit and the second pixel unit, the second sub-pixel is between a lower base of the first sub-pixel and a lower base of the third sub-pixel.

15. The array substrate of claim 1, wherein
a distance of a top surface of the first pixel defining layer from the substrate is smaller than that of a top surface of the second pixel defining layer from the substrate; and
the top surface is a surface of a pixel defining layer away from the substrate.

16. A display panel comprising the array substrate of claim 1.

17. The display panel of claim 16, wherein
each of the first pixel unit and the second pixel unit comprises a first sub-pixel, a second sub-pixel and a third sub-pixel;
the second sub-pixel is the rectangular sub-pixel, the at least one non-rectangular sub-pixel comprises two non-rectangular sub-pixels, and the first sub-pixel and the third sub-pixel are the non-rectangular sub-pixels;
in the first pixel unit, the first and third sub-pixels are at first and second sides of the second sub-pixel, respectively;
in the second pixel unit, the third sub-pixel and the first sub-pixel are at first and second sides of the second sub-pixel, respectively;
wherein a plurality of second sub-pixels in each of the plurality of first pixel unit columns are sequentially arranged along the column direction;
a plurality of second sub-pixels in each of the plurality of second pixel unit columns are sequentially arranged along the column direction;
in first and second pixel unit columns adjacent to each other arranged in the row direction, two third sub-pixels of any adjacent first and second pixel units have opposite sides, and a plurality of third sub-pixels of the plurality of first pixel units and a plurality of third sub-pixels of the plurality of second pixel units are alternately arranged in the column direction; and
in second and first pixel unit columns adjacent to each other arranged in the row direction, two first sub-pixels of any adjacent second and first pixel units have opposite sides, and a plurality of first sub-pixels of the plurality of first pixel units and a plurality of first sub-pixels of the plurality of second pixel units are alternately arranged in the column direction.

18. The display panel of claim 17, wherein the array substrate further comprises:
a plurality of first pixel defining layers, each of which is between any adjacent sub-pixels of the same color; and
a plurality of second pixel defining layers, each of which is between any adjacent sub-pixels of different colors,
wherein an angle between an extending direction of at least one of the plurality of first pixel defining layers and an extending direction of at least one of the plurality of second pixel defining layers is an acute angle.

19. The display panel of claim 18, wherein
each of the first sub-pixel and the third sub-pixel is an isosceles triangular sub-pixel,
in first and second pixel unit columns adjacent to each other, one leg of the first sub-pixel of each first pixel unit is opposite to a corresponding leg of the first sub-pixel of the second pixel unit adjacent to the first pixel unit, so that all the first sub-pixels in first and second pixel unit columns adjacent to each other are arranged in a column, and an orthographic projection of the first pixel defining layers between the first sub-pixels on the substrate has a zigzag shape;

in first and second pixel unit columns adjacent to each other, one leg of the third sub-pixel of each first pixel unit is opposite to a corresponding leg of the third sub-pixel of the second pixel unit adjacent to the first pixel unit, so that all the third sub-pixels in first and second pixel unit columns adjacent to each other are arranged in a column, and an orthographic projection of the first pixel defining layers between the third sub-pixels on the substrate has a zigzag shape;

in first and second pixel unit columns adjacent to each other, the first and second pixel units adjacent to each other are spaced apart from each other in the column direction by a distance equal to half of a length of the long side of the rectangular second sub-pixel; and wherein in each of the first pixel unit and the second pixel unit, the second sub-pixel is between a base of the first sub-pixel and a base of the third sub-pixel.

20. The display panel of claim 16, wherein the plurality of first pixel defining layers between any two adjacent first sub-pixels in each column of the first sub-pixels have a one-piece structure;

the plurality of first pixel defining layers between any two adjacent third sub-pixels in each column of the third sub-pixels have a one-piece structure;

the plurality of second pixel defining layers between each column of first sub-pixels and each column of second sub-pixels have a one-piece structure, such that an orthographic projection of the plurality of second pixel defining layers on the substrate is a straight line;

the plurality of second pixel defining layers between each column of third sub-pixels and each column of second sub-pixels have a one-piece structure, such that an orthographic projection of the plurality of second pixel defining layers on the substrate is a straight line;

the plurality of first pixel defining layers further comprise a first pixel defining layer between any two adjacent second sub-pixels of each column of second sub-pixels;

the extending direction of each of the plurality of first pixel defining layers between any two adjacent first sub-pixels in each column of first sub-pixels is at an acute angle with the extending direction of each of the plurality of second pixel defining layers between each column of the first sub-pixels and each column of the second sub-pixels; and the extending direction of each of the plurality of first pixel defining layers between any two adjacent third sub-pixels in each column of third sub-pixels is at an acute angle with the extending direction of each of the plurality of second pixel defining layers between each column of the third sub-pixels and each column of the second sub-pixels.

* * * * *